United States Patent
Soma

(10) Patent No.: US 8,610,168 B2
(45) Date of Patent: Dec. 17, 2013

(54) SEMICONDUCTOR DEVICE AND METHOD OF MANUFACTURING THE SAME

(75) Inventor: Mitsuru Soma, Kumagaya (JP)

(73) Assignee: ON Semiconductor Trading, Ltd., Hamilton (BM)

(*) Notice: Subject to any disclaimer, the term of this patent is extended or adjusted under 35 U.S.C. 154(b) by 161 days.

(21) Appl. No.: 13/117,498

(22) Filed: May 27, 2011

(65) Prior Publication Data

US 2011/0291242 A1    Dec. 1, 2011

(30) Foreign Application Priority Data

Jun. 1, 2010 (JP) .................................. 2010-125753

(51) Int. Cl.
*H01L 29/739* (2006.01)

(52) U.S. Cl.
USPC ............ 257/162; 257/E27.112; 257/E29.202; 257/E29.066; 438/311

(58) Field of Classification Search
USPC ........... 257/E29.201, E29.256, 162, E27.112, 257/E29.066, E29.202; 438/311
See application file for complete search history.

(56) References Cited

U.S. PATENT DOCUMENTS

| 7,109,551 B2 * | 9/2006 | Sugi et al. ..................... 257/330 |
| 7,470,960 B1 * | 12/2008 | Sugawara ..................... 257/401 |
| 7,602,025 B2 * | 10/2009 | Nishimura et al. ........... 257/378 |
| 7,898,008 B2 * | 3/2011 | Fallica et al. ................. 257/273 |

FOREIGN PATENT DOCUMENTS

JP          7-45699       2/1995

* cited by examiner

*Primary Examiner* — John C Ingham
(74) *Attorney, Agent, or Firm* — Morrison & Foerster LLP

(57) ABSTRACT

In a semiconductor device in which an IGBT, a control circuit for the IGBT and so on are formed on an SOI substrate divided by trenches, the invention is directed to providing the IGBT with a higher breakdown voltage, an enhanced turn-off characteristic and so on. An N type epitaxial layer is formed on a dummy semiconductor substrate, a trench is formed in the N type epitaxial layer, an N type buffer layer and then a P type embedded collector layer are formed on the sidewall of the trench and the front surface of the N type epitaxial layer, and the bottom of the trench and the P+ type embedded collector layer are covered by an embedded insulation film. The embedded insulation film is covered by a polysilicon film, and a P type semiconductor substrate is attached to the polysilicon film with an insulation film being interposed therebetween. Then the dummy semiconductor substrate is removed, thereby forming an SOI substrate having the embedded insulation film, the P+ type embedded collector layer, the N type buffer layer, the N type drift layer and so on that are exposed being almost flush with each other on the bottom of the trench. An IGBT and so on are formed on this SOI substrate.

6 Claims, 11 Drawing Sheets

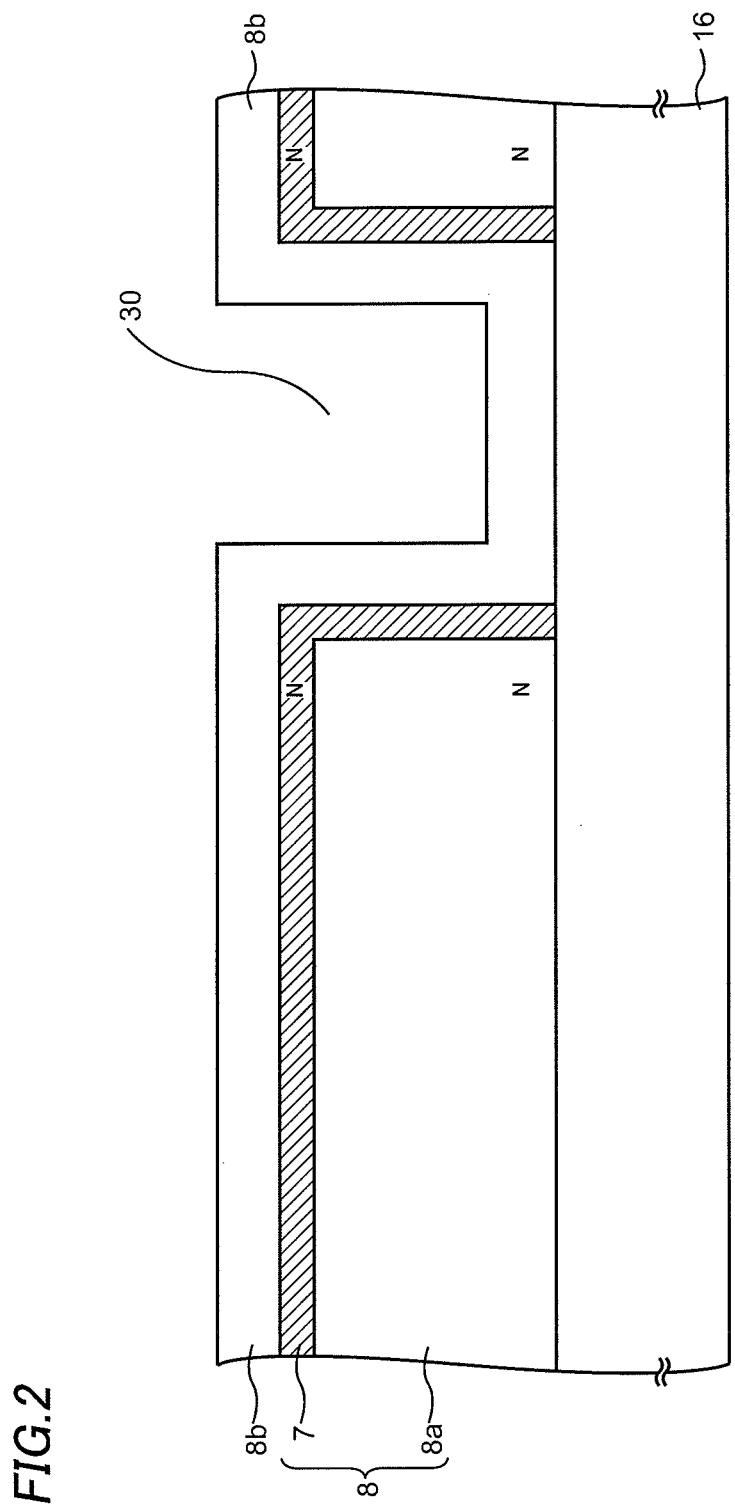

FIG.10 PRIOR ART

SEMICONDUCTOR DEVICE AND METHOD OF MANUFACTURING THE SAME

CROSS-REFERENCE OF THE INVENTION

This application claims priority from Japanese Patent Application No. 2010-125753, the content of which is incorporated herein by reference in its entirety.

BACKGROUND OF THE INVENTION

1. Field of the Invention

The invention relates to a semiconductor device that has an IGBT (Insulated Gate Bipolar Transistor) formed on an SOI (Silicon on Insulator) substrate divided by trenches and a method of manufacturing the same.

2. Description of the Related Art

A semiconductor device having an IGBT 54, control and drive circuits 55 for the IGBT 54, and so on formed on an SOI substrate divided by trenches 101,102,103 will be described referring to FIG. 10. A P− type semiconductor substrate 51 on which an IGBT 54, a control circuit 55 and so on are formed and isolated by dielectric isolation layers 56, 57, 58 is attached to a P− type semiconductor substrate 53 that is a supporting substrate and insulated from the P− type semiconductor substrate 51 by an embedded insulation film 52.

On the bottom portion of the P− type semiconductor substrate 51 adjacent to the embedded insulation film 52, a P+ type embedded emitter layer 59a is formed in the region for the IGBT 54 and a P+ type embedded layer 59b is formed in the region for the control circuit 55 and so on. A P+ type emitter layer 60 is formed in the region for the IGBT 54, being connected to the P+ type embedded layer 59a and extending along the sidewalls of the dielectric isolation layers 56, 57 to the front surface of the P− type semiconductor substrate 51 to be connected to the emitter electrode E1.

The IGBT 54 includes the emitter electrode E1 connected to an N+ type emitter layer 62, a P type base layer 63 and the P+ type emitter layer 60, a collector electrode C1 connected to a P+ type collector layer 64, an N type drift layer 65 and an N− type drift layer 66 that surround the P+ type collector layer 64, and a gate electrode G that extends from on the N− type drift layer 66 onto the N+ type emitter layer 62 with a gate insulation film 67 being interposed therebetween.

Although the control circuit 55 includes various device elements, an NPN bipolar transistor and a PNP bipolar transistor are representatively shown. The NPN bipolar transistor includes an emitter electrode E2 connected to an N+ type emitter layer 68 formed on the P− type semiconductor substrate 51 on the P+ type embedded layer 59b, a base electrode B2 connected to a P type base layer 69 surrounding the N+ type emitter layer 68, an N type collector layer 70 surrounding the P type base layer 69, and a collector electrode C2 connected to an N+ type embedded layer 71.

The PNP bipolar transistor includes an emitter electrode E3 connected to a P type emitter layer 72, a collector electrode C3 connected to a P type collector layer 73, a base electrode B3 connected to an N+ type embedded layer 74 surrounding the N type base layer 75. In this case, the N+ type embedded layer 71 and so on of the NPN bipolar transistor is formed in an inner region of the P− type semiconductor substrate 51 at about several μm from the front surface.

In the IGBT 54 in this figure, the emitter region is formed adjacent to the dielectric isolation layers 56, 57, and the collector region is formed in the center portion of the SOI island between the dielectric isolation layers 56, 57. In this structure, a collector current flows in the horizontal direction, and thus the channel density is low. Therefore, a structure of flowing a collector current in the vertical direction is employed by forming a plurality of emitter regions in the center of the SOI island so as to increase the channel density and by forming the collector region adjacent to the dielectric isolation layer.

In this case, the P+ type embedded emitter layer is replaced by a P+ type embedded collector layer, and the impurity concentration of the P+ type embedded collector layer need be high as much as possible so as to decrease the on-resistance. By replacing the P− type semiconductor substrate in the SOI island by an N− type semiconductor substrate, the N− type semiconductor substrate serves as an N type drift layer.

Such a semiconductor device having an IGBT and control and drive circuits for the IGBT foamed on an SOI substrate divided by trenches is disclosed in the Japanese Patent Application Publication No. Hei 7-45699.

The IGBT described above as having the emitter regions in the center portion of the island of the SOI substrate and having the collector region adjacent to the dielectric isolation layer 56 and so on, that is a modification of the IGBT described in the Japanese Patent Application Publication No. Hei 7-45699, is provided with a structure in which the impurity concentration of the P+ type embedded collector layer is increased so as to decrease the on-resistance as described above.

This contributes to increase in the dose of holes injected into the N type drift layer from the P+ type embedded collector layer when the IGBT is in the on state and thus decrease in the on-resistance of the low concentration N type drift layer, having an advantage in the so-called conductivity modulation effect. However, on the contrary, this has a problem of increasing the time until the recombination and extinction of excess injected holes are completed when the IGBT turns off, thereby causing degradation in the turn-off characteristic.

Furthermore, in order to form a high breakdown voltage IGBT, it is preferable to use a Floating zone (FZ) wafer of which the concentration of impurities such as oxygen is low as the P-type semiconductor substrate. However, since the diameters of semiconductor wafers are becoming larger, a Czochralski (CZ) wafer need be used instead of a FZ wafer having difficulty in increasing the diameter. This causes a problem in increasing the breakdown voltage and decreasing the leakage current.

Furthermore, the embedded collector layer and so on of the NPN bipolar transistor forming the control circuit or a P type low concentration embedded layer of a high breakdown voltage junction FET used for a level shifter in the P− type semiconductor substrate 51 need be formed in an inner region of the P− type semiconductor substrate 51 at about several μm from the front surface thereof. This need an ion implantation machine that applies a high current and high acceleration energy, and it is necessary to avoid crystal defects when ion implantation is performed. It is also necessary to address problems caused by using this P− type semiconductor substrate 51.

In the case of a high breakdown voltage IGBT, since the thickness of the SOI layer is thick, it is necessary to form deep trenches in the SOI layer. When the trench is deep, the thickness of a polysilicon filling the trench also becomes large and a recess portion is formed in the polysilicon on the trench. When a device element such as IGBT is formed on such a P− type semiconductor substrate, there is a problem that a planarization treatment need be performed on the polysilicon film.

Accordingly, the degradation of the turn-off characteristic, the problems caused by using the P− type semiconductor substrate 51, and the problems caused by forming the thick polysilicon film covering the trenches, as described above, need be addressed.

SUMMARY OF THE INVENTION

The invention provides a semiconductor device that includes an epitaxial layer of a first general conductivity type having a top surface and a bottom surface, a drift layer of the first general conductivity type formed in the epitaxial layer, a trench formed in the epitaxial layer so as to penetrate the epitaxial layer, a buffer layer of the first general conductivity type formed in the epitaxial layer so as to be at a sidewall of the trench and the bottom surface of the epitaxial layer, an embedded collector layer of a second general conductivity type covering the buffer layer, an embedded insulation film disposed at a top portion of the trench, extending down along the sidewall of the trench and covering the collector layer on the bottom surface of the epitaxial layer, a polysilicon film covering the embedded insulation film so as to fill the trench at least partially, an insulation film covering the polysilicon film, and a semiconductor substrate attached to the polysilicon film through the insulation film.

The invention also provides a method of manufacturing a semiconductor device. The method includes forming an epitaxial layer of a first general conductivity type on a dummy semiconductor substrate, forming a trench penetrating through the epitaxial layer so as to expose a front surface of the dummy semiconductor substrate, forming a buffer layer of the first general conductivity type on an exposed side surface of the trench of the epitaxial layer and an exposed outer surface of the epitaxial layer, forming a collector layer of a second general conductivity type covering the buffer layer, forming an insulation film on the collector layer in the trench and on the outer surface of the epitaxial layer, forming a polysilicon film covering the insulation film so as to fill the trench at least partially, attaching a semiconductor substrate to the polysilicon film so that an insulation film is disposed between the semiconductor substrate and the polysilicon film, and removing the dummy semiconductor substrate after the semiconductor substrate is attached.

BRIEF DESCRIPTION OF THE DRAWINGS

FIGS. 2 to 5 are cross-sectional views showing the method of manufacturing the semiconductor device of the first embodiment of the invention.

Figure 10:
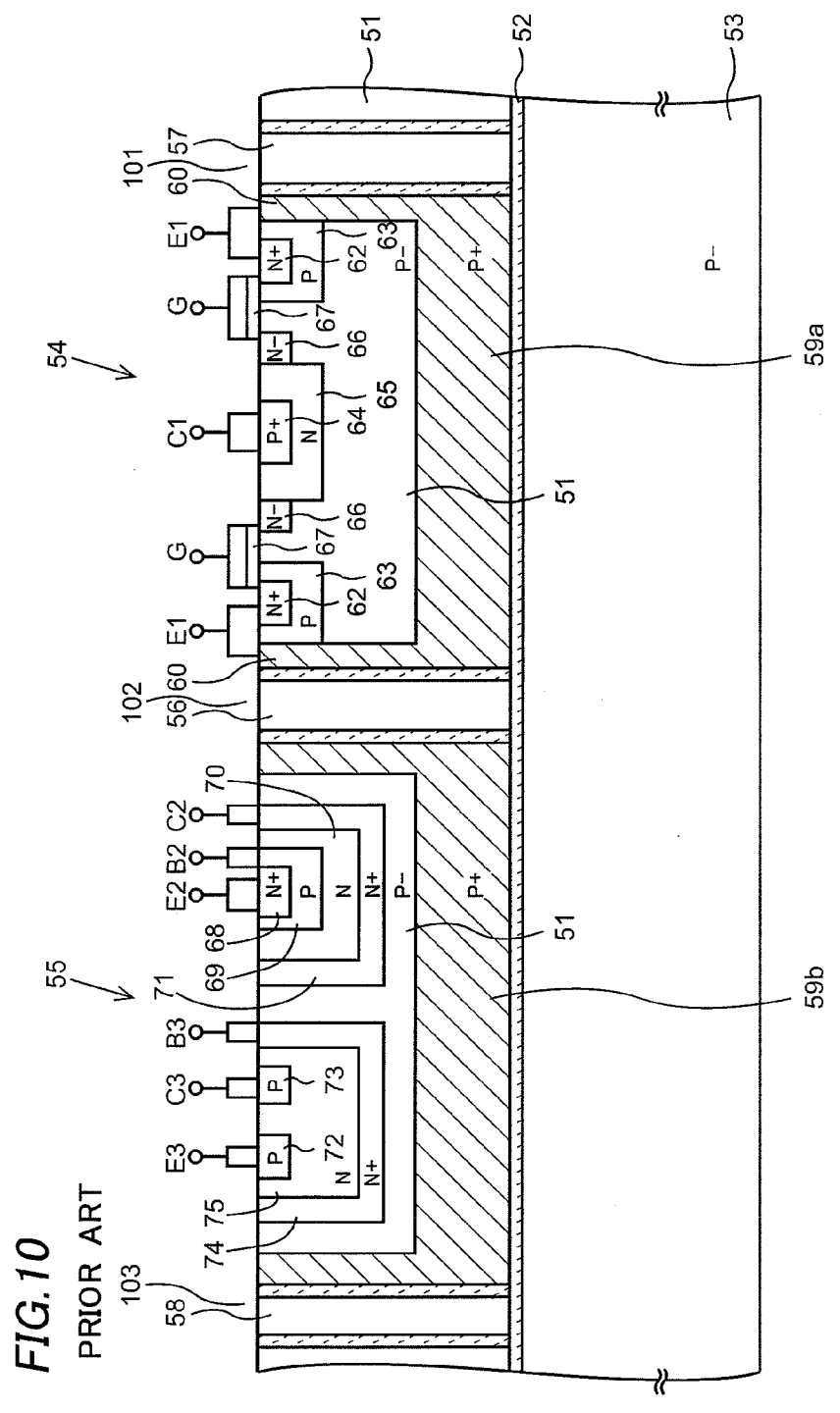

FIG. 10 is a cross-sectional view showing a conventional semiconductor device and a conventional method of manufacturing the semiconductor device.

DETAILED DESCRIPTION OF THE INVENTION

Figure 1A:
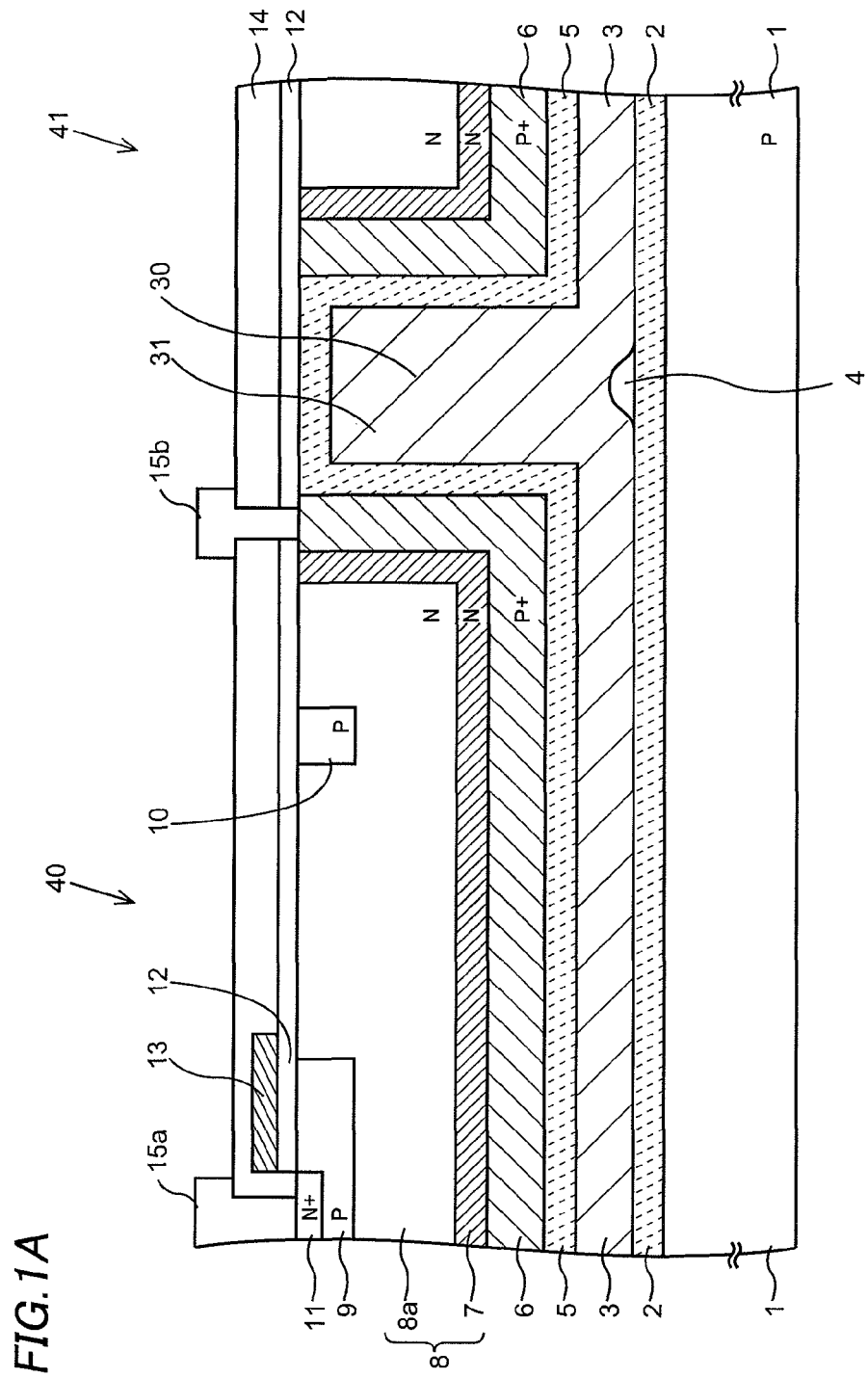
FIG. 1A is a cross-sectional view of a semiconductor device and a method of manufacturing the same of first to third embodiments of the invention.

A first embodiment of the invention will be described referring to FIG. 1. FIG. 1A is a cross-sectional view of a semiconductor device enlargedly showing a trench 30, a region 40 for an IGBT and a region 41 for a control circuit for the IGBT and so on, the regions being isolated by a dielectric isolation layer 31 made of an embedded insulation film 5 and so on. The IGBT region 40 actually has a symmetrical portion on the left side of an emitter electrode 15a in this figure, that is symmetrical to the portion on the right side, forming an SOI island for the IGBT as a whole.

Figure 1B:
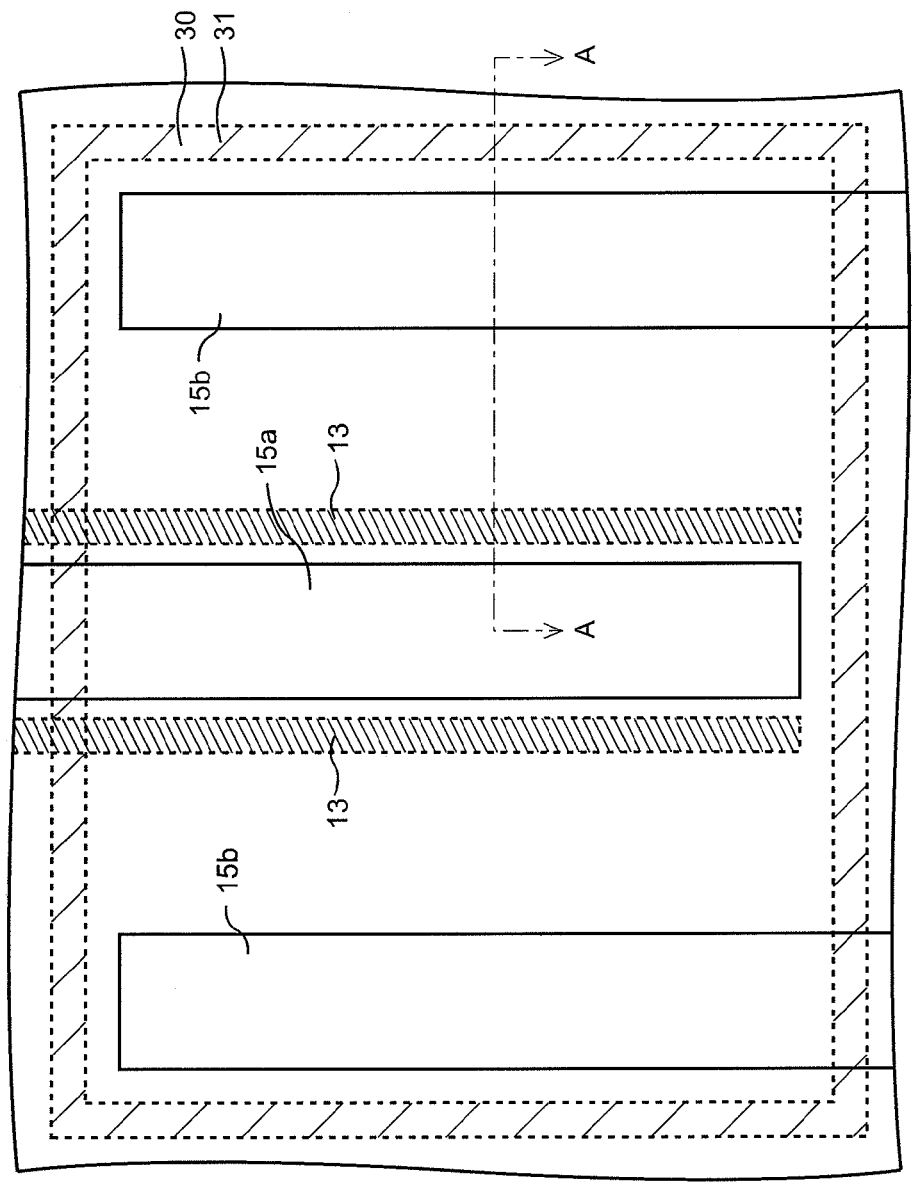
FIG. 1B is a plan view of the semiconductor device of first to third embodiments of the invention

FIG. 1B is a plan view of the semiconductor device. A plurality of N+ type emitter layers 11 are formed actually so as to increase the channel density although only one of these is shown in the figure. FIG. 1A is the cross-sectional view of FIG. 1B along line A-A.

The SOI substrate of the IGBT region 40 of the embodiment employs the following structure. A S (Silicon) layer in the SOI layer includes an N type drift layer 8a, an N type buffer layer 7 and a P+ type embedded collector layer 6, and an I (Insulator) layer in the SOI layer includes an embedded insulation film 5, a polysilicon film 3 that will be described below and an insulation film 2 formed on a P type semiconductor substrate 1 that is the supporting substrate of the SOI layer.

Furthermore, the S layer described above is formed such that the N type drift layer 8a and the N type buffer layer 7 are formed in the N type epitaxial layer 8 divided by the dielectric isolation layer 31 and the P+ type embedded collector layer 6 is formed on the N type buffer layer 7. The N type buffer layer 7 and the P+ type embedded collector layer 6 sequentially extend along the sidewall of the trench 30 onto the bottom of the N type drift layer 8a as shown in the figure.

The dielectric isolation layer 31 includes the embedded insulation film 5 covering the bottom of the trench 30, being almost flush with the front surface of the N type epitaxial layer 8, and extending on the P+ type embedded collector layer 6, and the polysilicon film 3 formed on the embedded insulation film 5 extending from on the P+ type embedded collector layer 6 onto the bottom of the trench 30 and filling the trench 30 completely or partially.

It is noted that conductivity types such as N+, N and N− belong in a general conductivity type and conductivity types such as P+, P and P− belong in the other general conductivity type.

Furthermore, since the IGBT of the embodiment has a high breakdown voltage, the thickness of the N type epitaxial layer 8 including the N type drift layer 8a is thick. Therefore, the trench 30 is deep, and the opening width of the trench 30 is large although it depends on the aspect ratio when the trench is etched. Therefore, the thickness of the polysilicon film 3 described above is also thick, and a recess portion 4 is formed in the polysilicon film 3 covering the trench 30 as shown in the figure. Depending on the opening width of the trench 30, the recess portion 4 reaches the inside of the trench 30.

The N type epitaxial layer 8 forming the S layer of the SOI structure as described above becomes the N type drift layer 8a and so on in the IGBT region 40 as described above. A P type base layer 9 is formed in the front surface of the N type drift layer 8a. At the same time when the P type base layer 9 is formed, a P type field ring 10 is further formed in the front surface of the N type drift layer 8a. The P type field ring 10 has a function of extending a depletion layer in the front surface of the N type drift layer 8a when a high voltage is applied to the IGBT, thereby preventing the dielectric breakdown of the IGBT in the front surface.

An N+ type emitter layer 11 is formed in the front surface of the P type base layer 9. Furthermore, a gate electrode 13 is formed on the P type base layer 9 with a gate insulation film 12 being interposed therebetween, extending from an end portion of the N+ type emitter layer 11 onto the N type drift layer 8a. The P type base layer 9 adjacent to the gate insulation film 12 under the gate electrode 13 becomes a channel layer turned to an N type layer when a positive voltage is applied to the gate electrode 13.

The emitter electrode 15a and the N+ type emitter layer 11 are connected and the collector electrode 15b and the P+ type embedded collector layer 6 are connected through contact holes formed in the interlayer insulation film 14 and the gate insulation film 12, thereby foaming the IGBT. Furthermore, an NPN bipolar transistor and so on (not shown) are formed in the region 41 for the control circuit and so on, for example.

As described above, a plurality of N+ type emitter layers 11 are formed actually so as to increase the channel density although only one of these is shown in the figure. The number of the P type field ring layers 10 is also increased as the breakdown voltage is increased although only one of these is shown.

Although the N type epitaxial layer 8 and so on forming the S layer of the embodiment are shown as being attached to the P type semiconductor substrate 1 with the I layer being interposed therebetween in the state where a dummy semiconductor substrate 16 that will be described below on which the N type epitaxial layer 8 is deposited does not exist, the N type epitaxial layer 8 is actually deposited on the dummy semiconductor substrate 16 as described below in detail in a method of manufacturing the semiconductor device. After the P type semiconductor substrate 1 that is the supporting substrate of the SOI layer is attached on the side on which the N type epitaxial layer 8 and so on are formed, the dummy semiconductor substrate 16 is removed by grinding and so on.

Hereafter, the features of the IGBT forming the semiconductor device of the embodiment will be described. A first feature that is largely different from the Japanese Patent Application Publication No. hei 7-45699 is that the S layer of the SOI layer is made of the N type epitaxial layer 8 and realizes a high breakdown voltage IGBT, different from that of this cited document. When a semiconductor integrated circuit is formed, ordinarily, a CZ type semiconductor substrate formed by a CZ method is used as the semiconductor substrate.

In a case of a semiconductor integrated circuit having a relatively low breakdown voltage IGBT, there does not occur a problem by using a CZ type semiconductor substrate. However, when the breakdown voltage of an IGBT is increased, since an ordinary CZ type semiconductor substrate contains a high concentration of impurities, in particular, oxygen, this causes crystal defects to increase the leakage current and decrease the breakdown voltage.

In an ordinary case, a discrete type high breakdown voltage IGBT is formed on a FZ type semiconductor substrate formed by a FZ method, of which the concentration of impurities such as oxygen is low. On the other hand, since the diameters of semiconductor substrates are remarkably increasing, a semiconductor integrated circuit manufacturing line is made mainly for a CZ type semiconductor substrate of 300 mmφ or more.

However, it is difficult to increase the diameter of a FZ type semiconductor substrate. Therefore, in order to realize a semiconductor device having a semiconductor integrated circuit in which an IGBT, peripheral circuits such as a control circuit for the IGBT, and so on are integrated, it is necessary to use a CZ type semiconductor substrate having a large diameter mainly used in a semiconductor integrated circuit manufacturing line. In this case, with a CZ type semiconductor substrate, it is difficult to realize a high breakdown voltage IGBT as described above.

Therefore, the embodiment described above realizes a high breakdown voltage IGBT by using the N type epitaxial layer 8 having a low concentration of impurities such as oxygen as the S layer of the SOI layer, that is deposited on a CZ type semiconductor substrate.

Furthermore, in the high breakdown voltage IGBT of the embodiment, since the N type drift layer 8a of the IGBT is made of the thick N type epitaxial layer 8, a depletion layer does not reach the P+ type embedded collector layer 6 even when a high voltage is applied to the IGBT. Therefore, the N type buffer layer 7 of which the impurity concentration is higher than that of the N type drift layer 8a is formed surrounding the N type drift layer 8a so as to decrease the on-resistance, and this is a second feature.

Furthermore, by providing the high concentration P+ type embedded collector layer 6, when the IGBT turns on, many holes are injected from the P+ type embedded collector layer 6 into the N type drift layer 8a, thereby obtaining a high conductivity modulation effect. However, this results in degradation of the turn-off characteristic since the extinction of excess holes injected into the N type drift layer 8a by the recombination delays when the IGBT turns off.

Therefore, the N type buffer layer 7 of which the impurity concentration is higher than that of the N type drift layer 8a is provided to enhance the recombination speed of excess holes injected from the P+ type embedded collector layer 6 into the N type drift layer 8a, thereby preventing the degradation of the turn-off characteristic. This is a third feature.

A fourth feature is that these N type buffer layer 7 and P+ type embedded collector layer 6 are formed on the bottom surface of the N type epitaxial layer 8 without excess diffusion. It is noted that the bottom surface of the N type epitaxial layer 8 is a surface opposite to the surface of the N type epitaxial layer 8 on which the emitter electrode 15a of the IGBT and so on are formed.

In an ordinary method of growing an N type epitaxial layer, it is difficult to form a layer such as the P+ type embedded collector layer 6 on the bottom surface of the thick N type epitaxial layer 8 without excess diffusion. The manufacturing method of the embodiment realizes forming the P+ type embedded collector layer 6 and so on the bottom surface of the thick N type epitaxial layer 8 without excess diffusion. This manufacturing method is a fifth feature.

A sixth feature is that the polysilicon film 3 covering the embedded insulation film 5 and the P type semiconductor substrate 1 that is the supporting substrate of the SOI layer are attached with the insulation film 2 formed on the P type semiconductor substrate 1 being interposed therebetween. The embedded insulation film 5 and the insulation film 2 are formed thin, and form the I layer together with the polysilicon film 3 between the embedded insulation film 5 and the insulation film 2. As a result, the buffer effect of the thin embedded insulation film 5 and so on and the polysilicon film 3 contributes to moderation of stress applied to the N type epitaxial layer 8 from the P type semiconductor substrate 1 by a heat treatment or the like.

As described in the Japanese Patent Application Publication No. Hei 7-45699, when a polysilicon film is formed on the front surface of a P− type semiconductor substrate 51 including in the trench from the side where the emitter electrode E and so on are formed, it is necessary to perform a treatment for planarizing a recess portion of the polysilicon film formed in the trench and so on. However, in the embodiment, a planarization treatment is not necessary even when the recess portion 4 is formed even slightly inside the trench 30 since only the P type semiconductor substrate 1 is attached thereto with the insulation film 2 being interposed therebetween. This is a seventh feature.

A last feature is that the thickness variation of the S layer of the SOI layer of the embodiment is decreased to about one fourth of that of the Japanese Patent Application Publication No. hei 7-45699. The variation of the S layer of the embodiment is within ±10% since the thickness variation of the N type epitaxial layer 8 mainly causes it. On the contrary, in the cited document, as well as the thickness variation of the P− type semiconductor substrate 51, there is the variation of the P− type semiconductor substrate 1 that occurs when it is ground and etched, thereby causing a variation of at least about ±40% as a whole. In the embodiment, the design flexibility of the on-resistance, the breakdown voltage and so on of the IGBT increases accordingly.

A method of manufacturing the semiconductor device of the embodiment will be described hereafter referring to FIGS. 1 to 5. First, as shown in FIG. 2, the N type epitaxial layer 8 is grown on the dummy semiconductor substrate 16 by a predetermined epitaxial method. Then the trench 30 extending from the front surface of the N type epitaxial layer 8 to the front surface of the dummy semiconductor substrate 16 is formed by a predetermined anisotropic dry-etching method or the like using an insulation film mask (not shown).

Then the N type buffer layer 7 extending from the N type epitaxial layer 8 exposed on the sidewall of the trench 30 onto the front surface of the N type epitaxial layer 8 is formed by thermal diffusion of phosphorus oxychloride ($POCl_3$) or the like, or ion implantation of phosphorus (P) and thermal diffusion. The N type buffer layer 7 may be formed by diffusion of phosphorus (P) from $POCl_3$ on the sidewall portion of the trench 30 using the insulation film mask mentioned above and ion implantation of phosphorus (P) on the front surface of the N type epitaxial layer. This case provides the N type buffer layer 7 of which the sidewall portion has higher concentration and lower resistance than the front surface portion. The N type epitaxial layer 8 on the inner side from the N type buffer layer 7 is to be the N type drift layer 8a.

Figure 3:
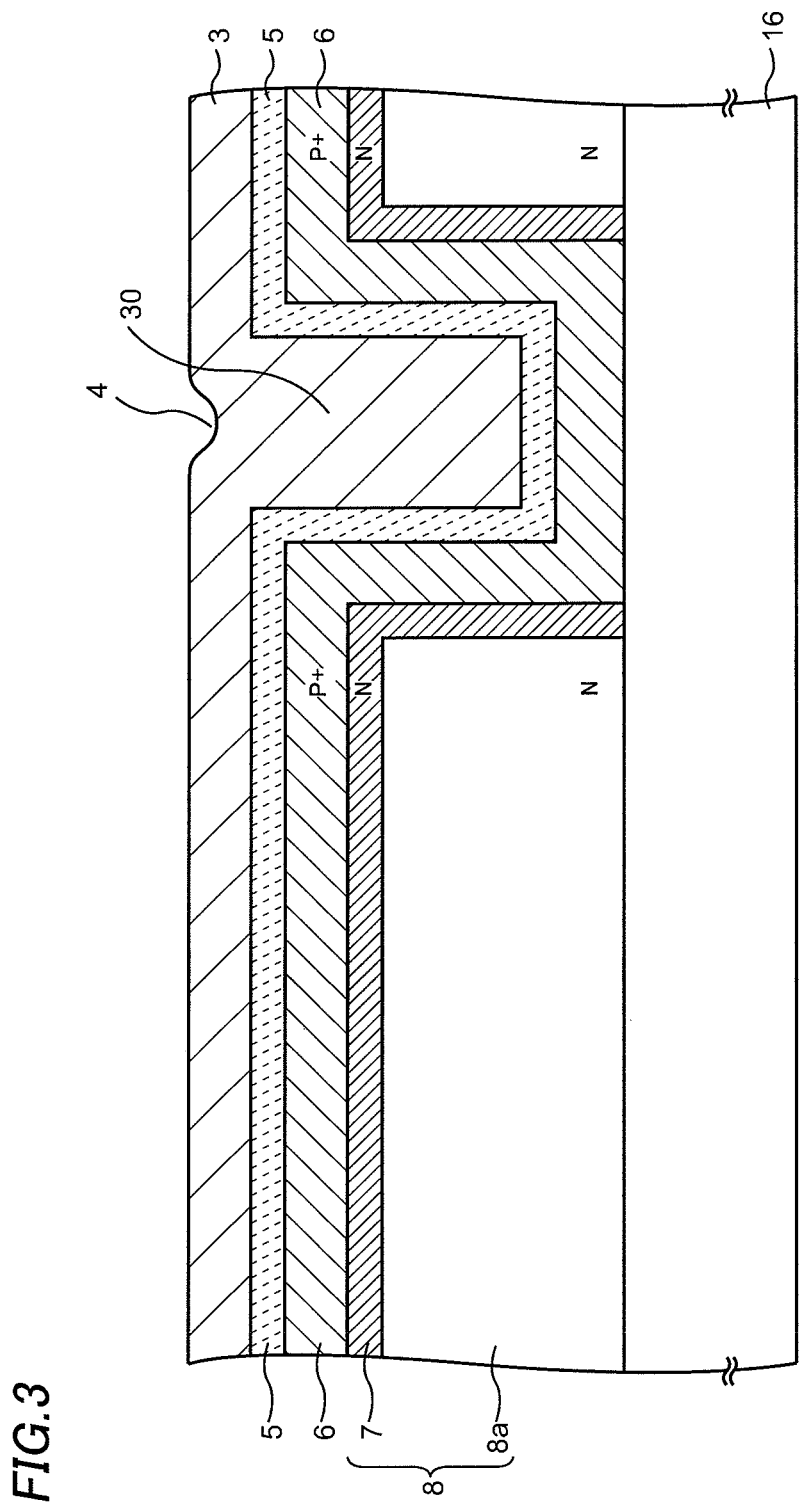

Then a second epitaxial layer 8b extending from the bottom of the trench 30 to cover the N type buffer layer 7 is formed by a predetermined method. As shown in FIG. 3, boron (B) is then thermally diffused in the epitaxial layer 8b using boron tribromide ($BBr_3$) or the like as an impurity source to turn the epitaxial layer 8b into the high concentration P+ type embedded collector layer 6.

Then the embedded insulation film 5 is formed on the front surface of the P+ type embedded collector layer 6 by thermal oxidation or the like. The polysilicon film 3 covering the embedded insulation film 5 including in the trench 30 is then formed by a predetermined low pressure CVD method or the like. In this case, the recess portion 4 is formed in the polysilicon film 3 on the trench 30.

It is noted that the second epitaxial layer 8b in FIG. 2 is not necessarily formed in order to form the P+ type embedded collector layer 6. The P+ type embedded collector layer 6 may be formed by forming the N type buffer layer 7 by diffusing impurities such as phosphorus (P) in the deeper portion of the N type epitaxial layer 8 and then thermally diffusing boron (B) in the N type buffer layer 7 using $BBr_3$ or the like as an impurity source. In this case, the embedded insulation film 5 is formed on the dummy semiconductor substrate 16 on the bottom of the trench 30.

The depth of the trench 30 formed in the thick N type epitaxial layer 8 is large, and the opening width is also large although it depends on the aspect ratio of the dry-etching or the like. When the opening width is large, the polysilicon film 3 does not fill the trench 30 enough and becomes in an incompletely embedded state. In this case, the recess portion 4 reaches the inside of the trench 30.

Figure 4:
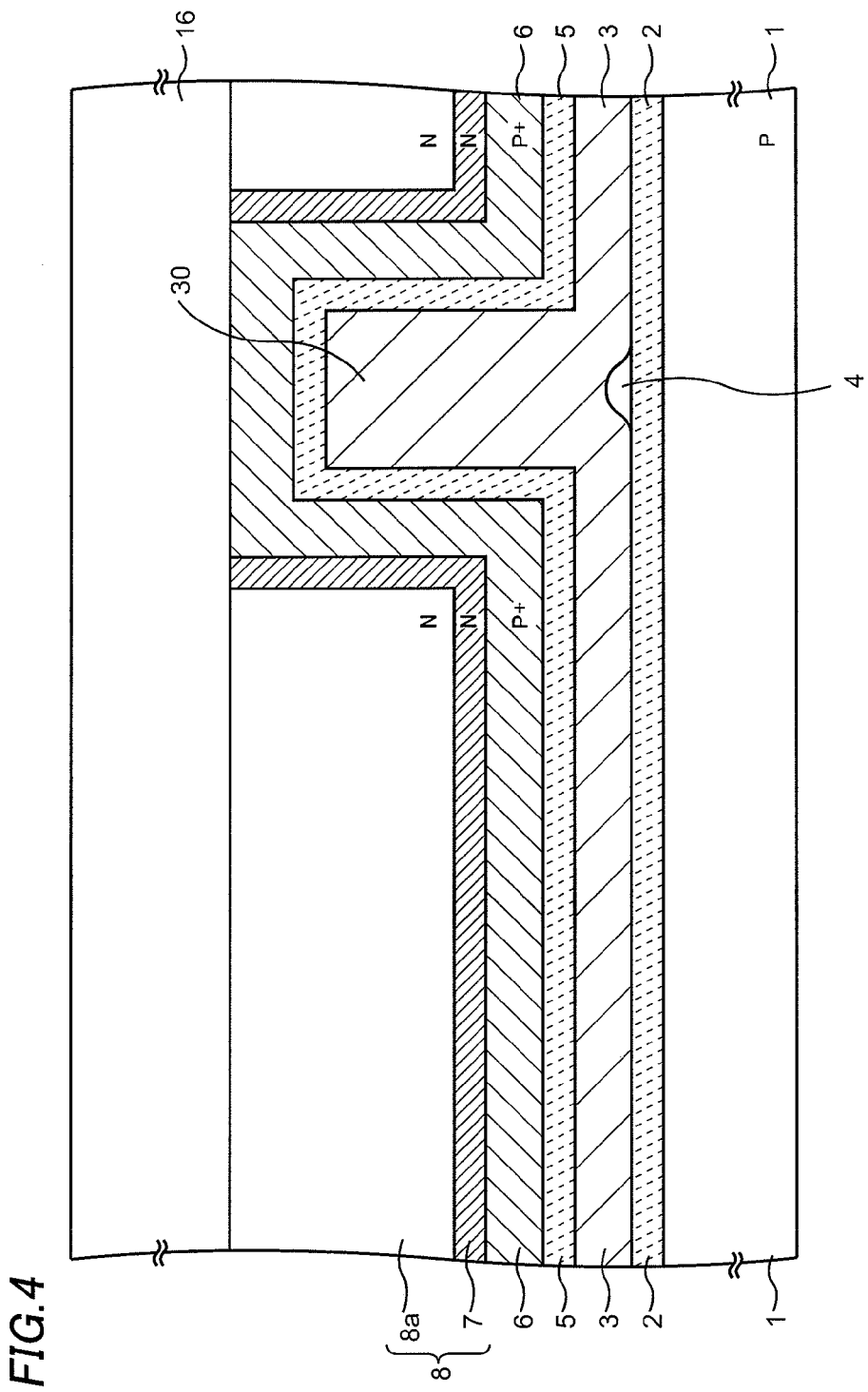

Then, as shown in FIG. 4, the polysilicon film 3 formed on the embedded insulation film 5 including inside the trench 30 and the P type semiconductor substrate 1 are attached with the insulation film 2 formed on the P type semiconductor substrate 1 being interposed therebetween.

After this, by performing a heat treatment in a high temperature furnace, the P type semiconductor substrate 1 as the supporting substrate and the SOI layer having the described structure are united to form an SOI substrate. In this case, although the recess portion 4 of the polysilicon film 3 remains between the P type semiconductor substrate 1 and the trench 30 portion of the SOI layer to decrease the planarity, this does not cause a particular problem since a device element and so on are not formed at this portion.

The I layer of the SOI layer employs the structure including the embedded insulation film 5, the insulation film 2, and the polysilicon film 3 between the embedded insulation film 5 and the insulation film 2 as described above. Since each of the thicknesses of the embedded insulation film 5 and the insulation film 2 is small and almost half of the embedded insulation film 51 of the Japanese Patent Application Publication No. hei 7-45699 and the polysilicon film 3 functions as a buffer, stress applied to the SOI layer from the P type semiconductor substrate 1 during the heat treatment is small. Therefore, the SOI layer is not curved, and thus the characteristics of the IGBT and so on formed on the SOI layer are stabilized.

Figure 5:
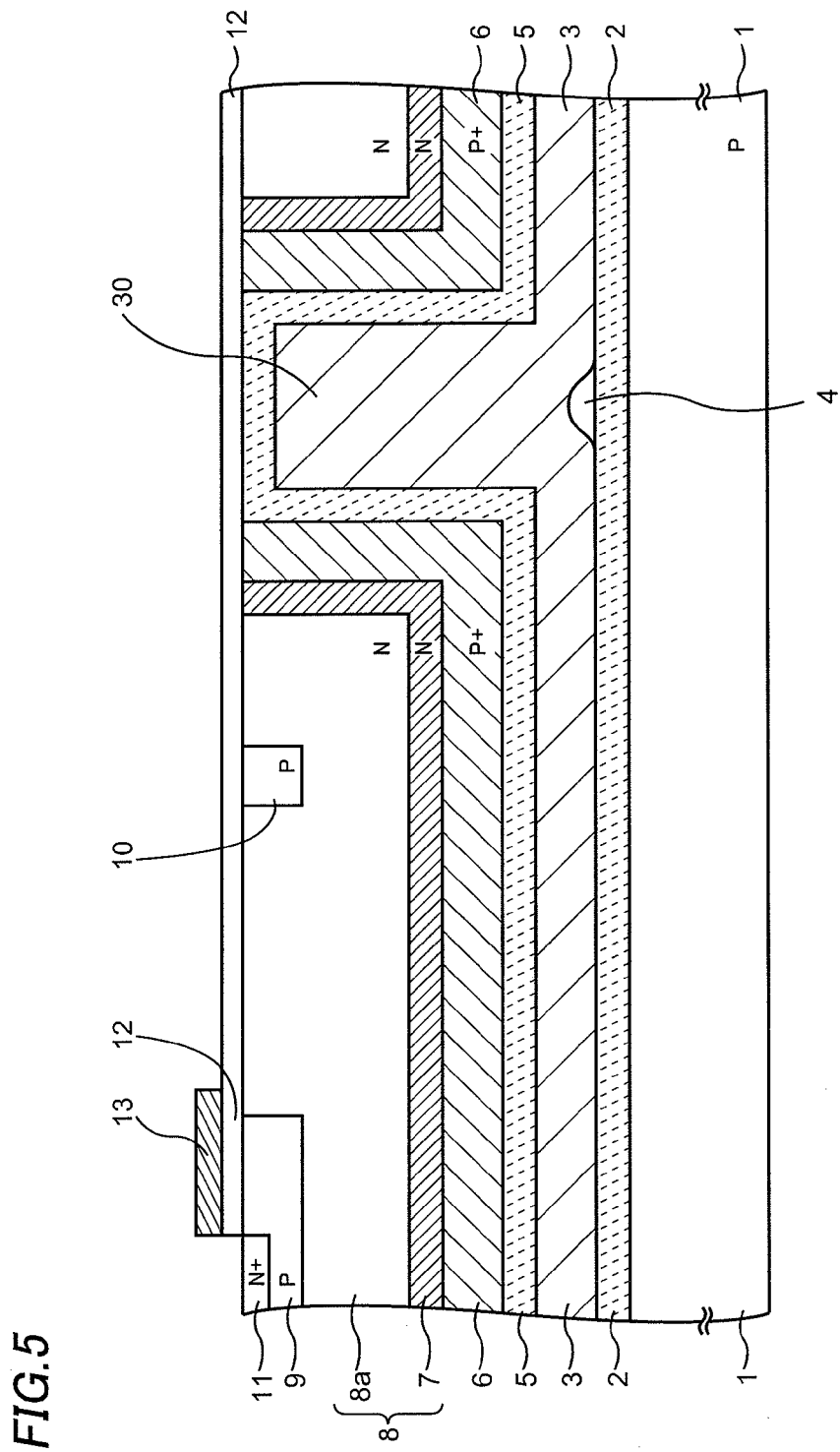

Then, as shown in FIG. 5, the dummy semiconductor substrate 16 on which the N type epitaxial layer 8 is deposited is ground by a predetermined thickness by a predetermined method, and the remaining dummy semiconductor substrate 16 and a part of the N type epitaxial layer 8, the N type buffer layer 7 and the P+ type embedded collector layer 6 are etched back by a predetermined method.

As a result, the SOI substrate is completed, in which the P type semiconductor substrate 1 as the supporting substrate is attached on the back surface side and the N type epitaxial layer 8 including the N type drift layer 8a, the N type buffer layer 7, the P+ type embedded layer 6 and the embedded insulation film 5 on the bottom of the trench 30 are exposed on the front surface side.

As the dummy semiconductor substrate 16, a dummy semiconductor substrate 16 doped with a high concentration of antimony (Sb) is effective to use. After the process of partially grinding the dummy semiconductor substrate 16 after the P type semiconductor substrate 1 is attached, the remaining dummy semiconductor substrate 16 doped with a high concentration of antimony (Sb) can be over-etched enough with mixed acid made of hydrofluoric acid, nitric acid, acetic acid or the like. This is because that the etching speed is higher than that for the N type epitaxial layer 8 by double digits. Therefore, even when there is variation in the thickness of the dummy semiconductor substrate 16, this does not have a large influence to cause variation in the thickness of the S layer.

When the P+ type embedded collector layer 6 is formed on the N type buffer layer 7 without the second epitaxial layer 8b, the embedded insulation film 5 on the bottom of the trench 30 is formed on the dummy semiconductor substrate 16 as described above. Therefore, by grinding and etching the dummy semiconductor substrate 16 and so on to expose the N type epitaxial layer and so on, the embedded insulation film 5 on the bottom of the trench 30 is exposed higher than the N type epitaxial layer 8 and so on by about 40% of the thickness of the embedded insulation film 5. However, the gap is small and does not have a large influence on the planarity.

As described above, the region of the N type epitaxial layer 8 of the IGBT region 40, that is surrounded by the N type buffer layer 7, becomes the N type drift layer 8a of the IGBT. Then the P type base layer 9 and the P type field ring 10 are formed in the N type drift layer 8a. The gate insulation film 12 is then formed, and the gate electrode 13 is formed on the P type base layer 9 with the gate insulation film 12 being interposed therebetween so as to extend onto the N type drift layer 8a. The N+ type emitter layer 11 is then formed in the P type base layer 9 using the gate electrode 13 as a mask.

Necessary device elements such as, for example, an NPN bipolar transistor (not shown) are formed on the S layer of the region 41 for the control circuit and so on, too. Then, as shown in FIG. 1, the interlayer insulation film 14 is formed by a predetermined CVD method or the like, and contact holes are formed in the interlayer insulation film 14 and so on by a predetermined photo-etching method. Then a metal film is formed by a predetermined CVD method or a sputtering method, and the emitter electrode 15a and so on connected to the N+ type emitter layer 11 of the SOI layer and so on are formed from the metal film by a predetermined photo-etching method.

Then a multilayer wiring structure and so on are formed by a predetermined method, and a protection film made of a passivation silicon nitride film or the like is formed, thereby completing the semiconductor device having the IGBT, the control circuit for the IGBT, and so on in the wafer state.

A second embodiment of the invention will be described referring to FIGS. 1, 5, 6 to 8. A cross-sectional view of a semiconductor device of this embodiment is the same as FIG. 1 showing the first embodiment. Therefore, the structure of the SOI substrate and the features of the IGBT are also the same as those of the first embodiment. There is a difference in the manufacturing method from that of the first embodiment.

Figure 6:
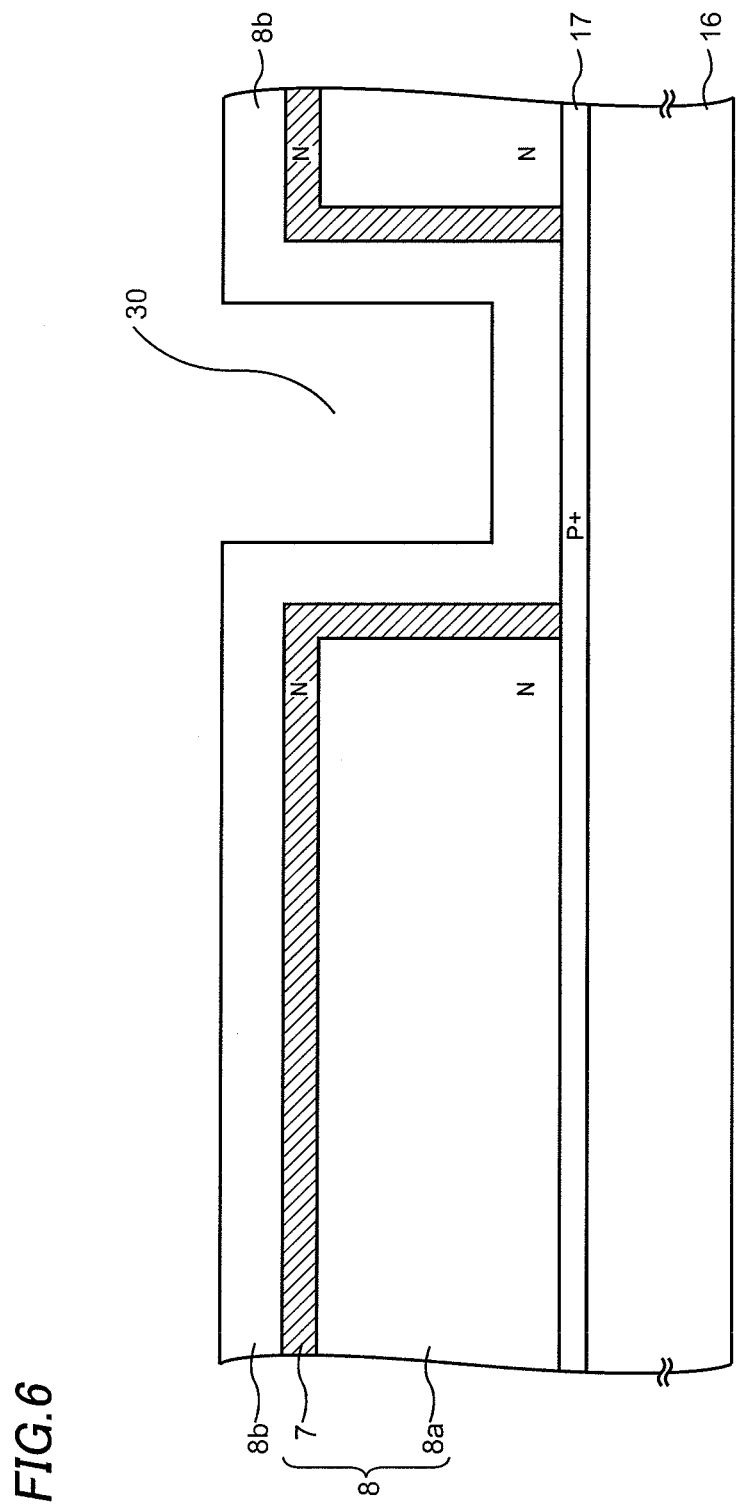
FIGS. 6 to 8 are cross-sectional views showing the method of manufacturing the semiconductor device of the second embodiment of the invention.
Figure 7:
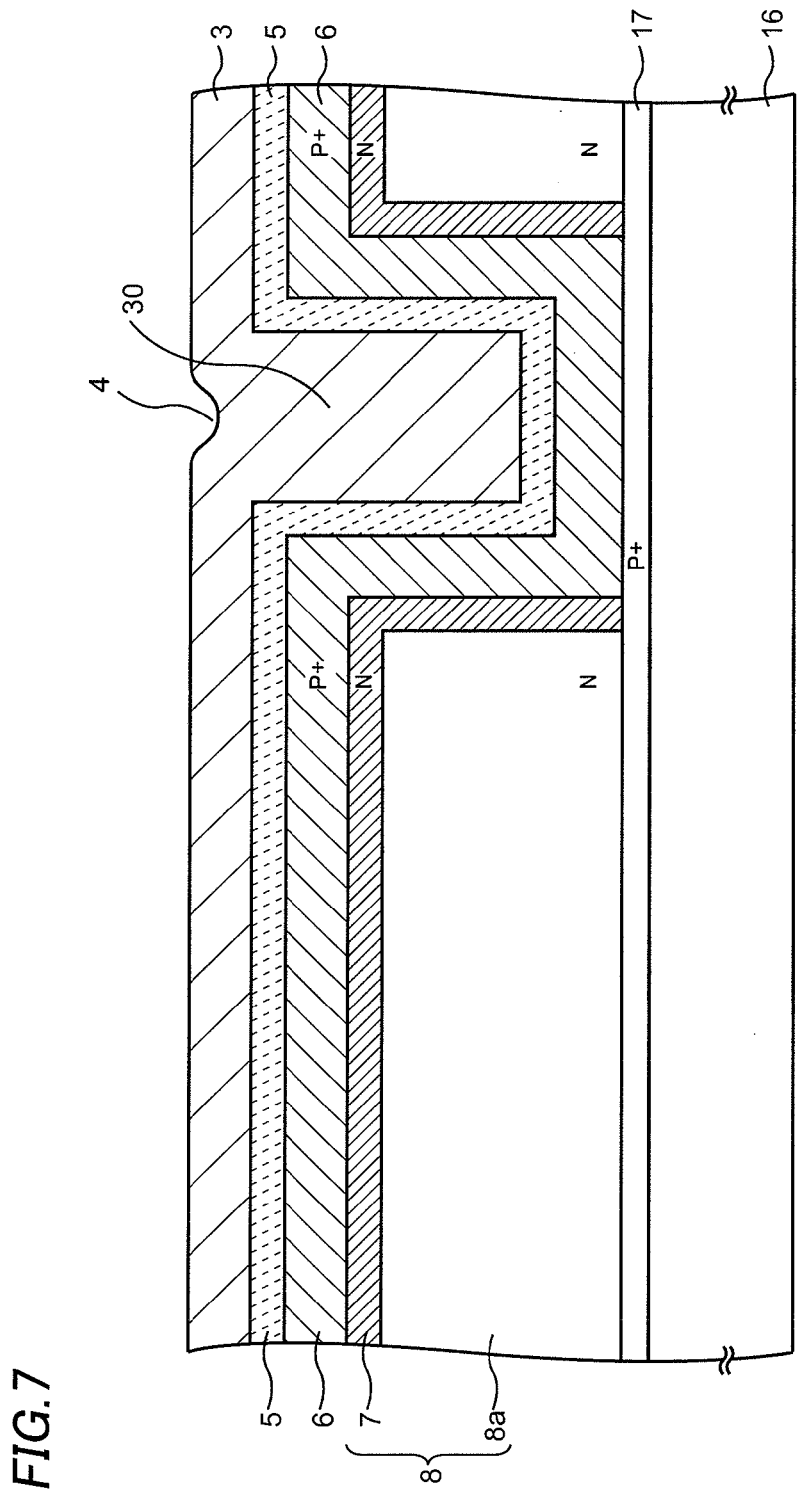
Figure 8:
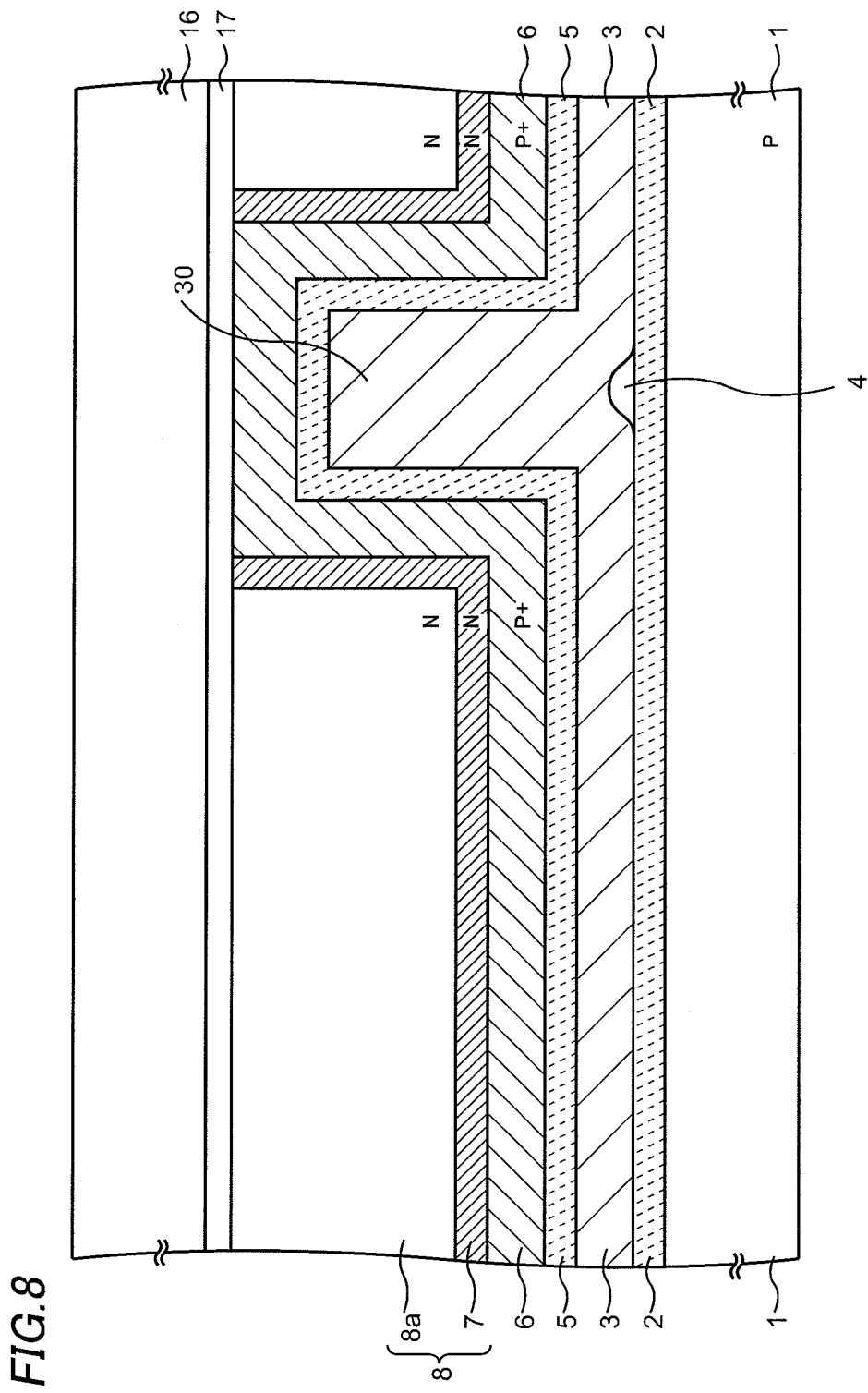

The difference from the first embodiment will be described referring to FIGS. 6 to 8 showing the method of manufacturing the semiconductor device. First, as shown in FIG. 6, the dummy semiconductor substrate 16 is provided as is the same as the first embodiment. Then, before the N type epitaxial layer 8 is grown, a P+ type trench etching stopper 17 is formed on the dummy semiconductor substrate 16 by diffusing boron (B) or the like by a predetermine method. This step provides a feature that will be described below. Then the N type epitaxial layer 8 is formed, and the trench 30 is formed in the N type epitaxial layer so as to reach the front surface of the dummy semiconductor substrate 16.

In this case, an ordinary dry-etching method for forming the trench 30 is employed, but the N type epitaxial layer 8 is not completely etched and a predetermined thickness portion is left. Then a finishing etching is performed with an alkali etchant of which the etching rate for the high concentration P+ type channel stopper 17 is lower than the etching rate for the N type epitaxial layer 8, i.e., one tenth of the etching rate for the N type epitaxial layer 8.

As a result of this, even by over-etching with an alkali etchant when the trench is formed, the trench 30 is formed from the front surface of the N type epitaxial layer 8 to the front surface of the dummy semiconductor substrate 16 and the dummy semiconductor substrate 16 is not etched. This is the feature of this embodiment.

In the case of the first embodiment, the dummy semiconductor substrate 16 on the bottom of the trench 30 is etched by an over-etching amount to form a recess portion. Therefore, the recess portion also remains in the embedded insulation film 5 on the bottom of the trench 30. The forming of the N type buffer layer 7 and the second epitaxial layer 8a thereafter is the same as in the first embodiment.

Then, as shown in FIG. 7, the P+ type embedded collector layer 6, the embedded insulation film 5 and the polysilicon film 3 are formed, and this is also the same as in the first embodiment. The existence of the P+ type trench etching stopper 17 is the only difference. The recess portion 4 of the polysilicon film 3 on the trench 30 is shallower than in the first embodiment, since there does not exist a recess portion in the dummy semiconductor substrate 16 by over-etching when the trench 30 is formed.

Then, as shown in FIG. 8, the SOI layer is attached to the P type semiconductor substrate 1 that is the supporting substrate of the SOI layer, and this is the same as in the first embodiment. At this time, the P+ type trench etching stopper 17 still remains on the dummy semiconductor substrate 16.

Then, as shown in FIG. 5, the dummy semiconductor substrate 16 is ground and etched, and at this time the P+ type trench etching stopper 17 formed on the front surface of the dummy semiconductor substrate 16 is also etched back and removed. The processes after this are the same as in the first embodiment, and the semiconductor device of the embodiment is completed.

A cross-sectional view of a semiconductor device of this embodiment of the invention is almost the same as FIG. 1 of the first embodiment. Therefore, this has all the features of the first embodiment. A difference from the first embodiment is that the impurity profile of the N type epitaxial layer 8 inclines toward the center portion from both the ends of the N type epitaxial layer 8.

Figure 9:
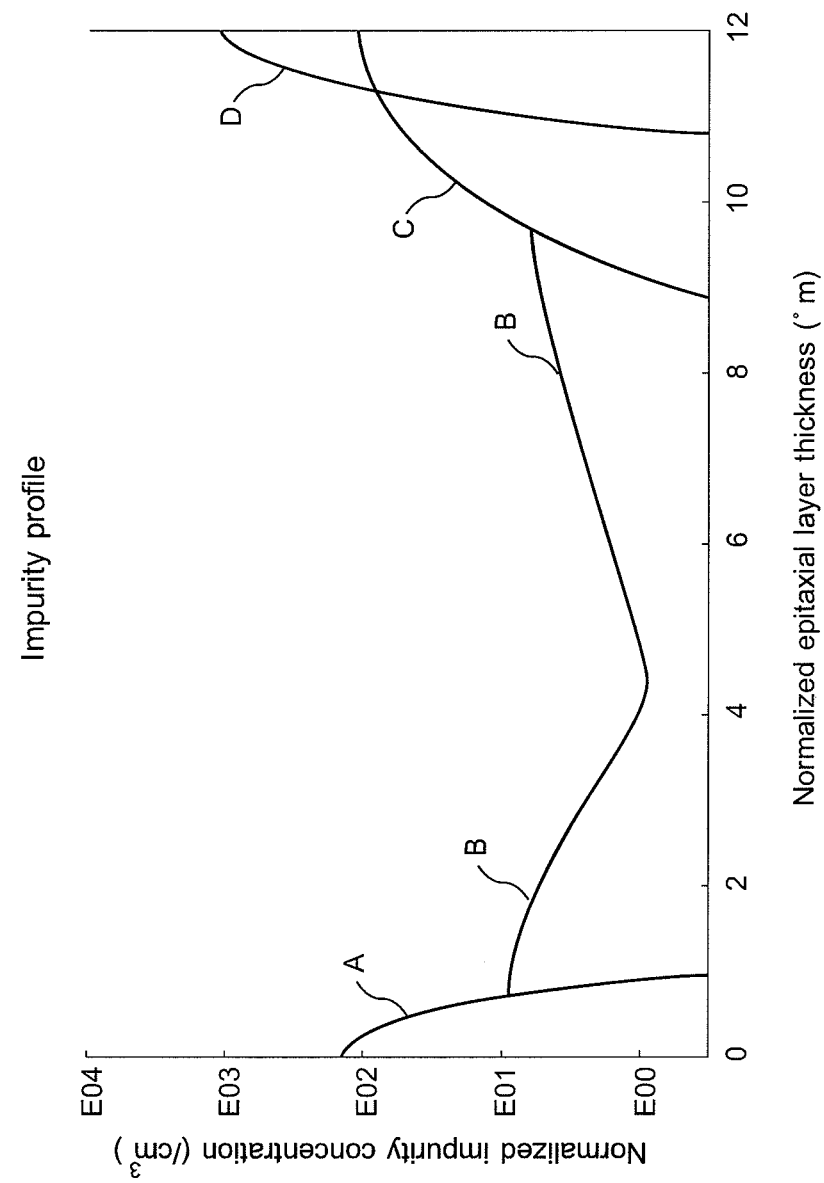
FIG. 9 is a graph showing an impurity profile of an SOI substrate of the semiconductor device of the third embodiment of the invention.

This is shown in FIG. 9 as a relation of a normalized epitaxial layer thickness and a normalized impurity concentration. A in this figure indicates the impurity profile of the P type base layer 9, D indicates the impurity profile of the P+ type embedded collector layer 6, C indicates the impurity profile of the N type buffer layer 7, and B indicates the impurity profile of the N type epitaxial layer 8. The impurity concentration of the N type epitaxial layer 8 gradually decreases toward the center portion from both the ends, and has the lowest portion of the impurity concentration. It is preferable to form the lowest impurity concentration portion in a position slightly shifted toward the P type base layer 9 from the center portion of the N type epitaxial layer 8.

The N type epitaxial layer 8 forms the N type drift layer 8a of the IGBT. When the IGBT is in the on state, electrons are injected from the N+ type emitter layer 11 and holes are injected from the P+ type embedded collector layer 6, thereby having the so-called conductivity modulation effect and decreasing the on-resistance of the IGBT.

In this case, in the state where the impurity concentration gradually decreases from the upper and lower ends of the N type drift layer 8a shown in FIG. 1 and a recess portion having a low impurity concentration is formed in the N type drift layer 8a, holes injected from the P+ type embedded collector layer 6 into the recess portion do not easily escape from there. As a result, a region containing many holes is formed in the N type drift layer 8a, thereby further increasing the conductivity modulation effect. This is the feature of this embodiment.

A method of manufacturing the semiconductor device of the embodiment is also the same as that of the first embodiment except that the impurity concentration of the N type epitaxial layer 8 is decreased toward the center portion. In order to decrease the impurity concentration of the N type epitaxial layer 8 toward the center portion, the flow rate of phosphine ($PH_3$) gas is only changed with the growing time of the N type epitaxial layer 8.

A cross-sectional view of a semiconductor device of this embodiment of the invention is the same as that of the first embodiment. Therefore, the features are the same as those of the first embodiment. A difference from the first embodiment is that the N type epitaxial layer 8 is replaced by a non-doped epitaxial layer. This realizes decreasing the thickness of the epitaxial layer, thereby decreasing the depth of the trench 30 and the opening width thereof. Therefore, the channel density and so on are enhanced accordingly.

By the semiconductor device and the method of manufacturing the same of the invention, the conductivity modulation effect of an IGBT is enhanced while the turn-off characteristic is prevented from degrading. Problems caused by using a P– type semiconductor substrate are solved, and a polysilicon film filling a trench is effectively used.

What is claimed is:

1. A semiconductor device comprising:
    an epitaxial layer of a first general conductivity type having a top surface and a bottom surface;
    a drift layer of the first general conductivity type formed in the epitaxial layer;
    a trench formed in the epitaxial layer so as to penetrate the epitaxial layer;
    a buffer layer of the first general conductivity type formed in the epitaxial layer so as to be at a sidewall of the trench and the bottom surface of the epitaxial layer;
    an embedded collector layer of a second general conductivity type covering the buffer layer
    an embedded insulation film disposed at a top portion of the trench, extending down along the sidewall of the trench and covering the collector layer on the bottom surface of the epitaxial layer;
    a polysilicon film covering the embedded insulation film so as to fill the trench at least partially;
    an insulation film covering the polysilicon film; and
    a semiconductor substrate attached to the polysilicon film through the insulation film.

2. The semiconductor device of claim 1, wherein the epitaxial layer comprises a high resistance epitaxial layer made of a non-doped layer.

3. The semiconductor device of claim 1, further comprising a second epitaxial layer formed on the first epitaxial layer, wherein the embedded collector layer is formed in the second epitaxial layer.

4. The semiconductor device of claim 1, wherein the polysilicon film extends from the trench to run under the collector layer.

5. The semiconductor device of claim 1, further comprising an emitter layer of the first general conductivity type.

6. A semiconductor device comprising:
    an epitaxial layer of a first general conductivity type having a top surface and a bottom surface;
    a drift layer of the first general conductivity type formed in the epitaxial layer;
    a trench formed in the epitaxial layer so as to penetrate the epitaxial layer;
    a buffer layer of the first general conductivity type formed in the epitaxial layer so as to be at a sidewall of the trench and the bottom surface of the epitaxial layer;
    an embedded collector layer of a second general conductivity type covering the buffer layer;
    an embedded insulation film disposed at a top portion of the trench, extending down along the sidewall of the trench and covering the collector layer on the bottom surface of the epitaxial layer;
    a polysilicon film covering the embedded insulation film so as to fill the trench at least partially;
    an insulation film covering the polysilicon film; and
    a semiconductor substrate attached to the olysilicon film through the insulation film,
    wherein an impurity concentration of the epitaxial layer decreases from both ends of the epitaxial layer toward an inner portion of the epitaxial layer, and the epitaxial layer has a low impurity concentration region in the inner portion.

\* \* \* \* \*